(12) United States Patent
Jeon et al.

(10) Patent No.: US 10,338,983 B2
(45) Date of Patent: Jul. 2, 2019

(54) METHOD AND SYSTEM FOR ONLINE PROGRAM/ERASE COUNT ESTIMATION

(71) Applicant: EMC IP Holding Company LLC, Hopkinton, MA (US)

(72) Inventors: Seungjune Jeon, Santa Clara, CA (US); Haleh Tabrizi, San Francisco, CA (US); Andrew Cullen, Cork (IE)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/395,248

(22) Filed: Dec. 30, 2016

(65) Prior Publication Data

US 2018/0189123 A1    Jul. 5, 2018

(51) Int. Cl.
*G06F 3/06* (2006.01)
*G06F 11/07* (2006.01)
*G06F 11/00* (2006.01)

(52) U.S. Cl.
CPC .......... *G06F 11/076* (2013.01); *G06F 3/0619* (2013.01); *G06F 3/0652* (2013.01);
(Continued)

(58) Field of Classification Search
CPC .. G06F 11/1048; G06F 3/0619; G06F 3/0613; G06F 3/0611; G06F 11/076;
(Continued)

(56) References Cited

U.S. PATENT DOCUMENTS 6,016,275 A   1/2000  Han
6,862,675 B1  3/2005  Wakimoto
(Continued)

FOREIGN PATENT DOCUMENTS

CN   102150140 A   8/2011
CN   103902234 A   7/2014
(Continued)

OTHER PUBLICATIONS

Hyojin Choi et al.; "VLSI Implementation of BCH Error Correction for Multilevel Cell NAND Flash Memory"; IEEE Transactions on Very Large Scale Integration (VLSI) Systems; vol. 18, No. 5; pp. 843-847; May 2010 (5 pages).
(Continued)

*Primary Examiner* — Guy J Lamarre
(74) *Attorney, Agent, or Firm* — Chamberlain, Hrdlicka, White, Williams & Aughtry

(57) ABSTRACT

In general, the technology relates to a method for managing persistent storage. The method includes selecting a sample set of physical addresses in a solid state memory module, and performing a garbage collection operation on the sample set of physical addresses. The method further includes, after the garbage collection operation, issuing a write request to the sample set of physical addresses, issuing a request read to the sample set of physical addresses to obtain a copy of the data stored in the sample set of physical addresses, determining an error rate in the copy of the data stored using an Error Correction Code codeword or known data in the write request, determining a calculated P/E cycle value for the SSMM using at least the error rate, and updating an in-memory data structure in a control module with the calculated P/E cycle value.

16 Claims, 9 Drawing Sheets

(52) U.S. Cl.
CPC .......... *G06F 3/0653* (2013.01); *G06F 3/0658* (2013.01); *G06F 3/0679* (2013.01); *G06F 11/079* (2013.01); *G06F 11/0727* (2013.01)

(58) Field of Classification Search
CPC .. G06F 11/079; G06F 11/0727; G06F 3/0652; G06F 3/0679; G11C 2029/0411; G11C 16/26
See application file for complete search history.

(56) References Cited

U.S. PATENT DOCUMENTS

| | | | |
|---|---|---|---|
| 7,559,004 | B1 | 7/2009 | Chang et al. |
| 8,189,379 | B2 | 5/2012 | Camp et al. |
| 8,259,506 | B1 | 9/2012 | Sommer et al. |
| 8,305,812 | B2 | 11/2012 | Levy et al. |
| 8,335,893 | B2 | 12/2012 | Tagawa |
| 8,694,724 | B1 | 4/2014 | Linnell et al. |
| 8,819,503 | B2 | 8/2014 | Melik-Martirosian |
| 8,868,842 | B2 | 10/2014 | Yano et al. |
| 8,891,303 | B1 | 11/2014 | Higgins et al. |
| 8,934,284 | B2 | 1/2015 | Patapoutian et al. |
| 8,995,197 | B1 | 3/2015 | Steiner et al. |
| 9,026,764 | B2 | 5/2015 | Hashimoto |
| 9,195,586 | B2 | 11/2015 | Cometti et al. |
| 9,330,767 | B1 | 5/2016 | Steiner et al. |
| 9,368,225 | B1 | 6/2016 | Pinkovich et al. |
| 9,496,043 | B1 | 11/2016 | Camp et al. |
| 9,564,233 | B1 | 2/2017 | Cho et al. |
| 9,606,737 | B2 | 3/2017 | Kankani et al. |
| 9,645,177 | B2 | 5/2017 | Cohen et al. |
| 9,690,655 | B2 | 6/2017 | Tabrizi et al. |
| 9,710,180 | B1 | 7/2017 | Van Gaasbeck |
| 9,798,334 | B1 | 10/2017 | Tabrizi et al. |
| 9,842,060 | B1 | 12/2017 | Jannyavula Venkata et al. |
| 9,864,525 | B2 | 1/2018 | Kankani et al. |
| 9,891,844 | B2 | 2/2018 | Kankani et al. |
| 9,905,289 | B1 | 2/2018 | Jeon et al. |
| 2005/0172082 | A1 | 8/2005 | Liu et al. |
| 2005/0223185 | A1 | 10/2005 | Lee |
| 2005/0278486 | A1 | 12/2005 | Tricka et al. |
| 2007/0260811 | A1 | 11/2007 | Merry, Jr. et al. |
| 2007/0263444 | A1 | 11/2007 | Gorobets et al. |
| 2007/0266200 | A1 | 11/2007 | Gorobets et al. |
| 2008/0082725 | A1 | 4/2008 | Elhamias |
| 2008/0082726 | A1 | 4/2008 | Elhamias |
| 2009/0144598 | A1 | 6/2009 | Yoon et al. |
| 2010/0306577 | A1 | 12/2010 | Dreifus et al. |
| 2010/0306580 | A1 | 12/2010 | McKean et al. |
| 2010/0332923 | A1 | 12/2010 | D'Abreu et al. |
| 2011/0173484 | A1 | 7/2011 | Schuette et al. |
| 2011/0202818 | A1 | 8/2011 | Yoon et al. |
| 2012/0110239 | A1 | 5/2012 | Goss et al. |
| 2012/0192035 | A1 | 7/2012 | Nakanishi |
| 2012/0236656 | A1 | 9/2012 | Cometti |
| 2012/0239991 | A1 | 9/2012 | Melik-Martirosian |
| 2012/0268994 | A1 | 10/2012 | Nagashima |
| 2012/0290899 | A1 | 11/2012 | Cideciyan et al. |
| 2013/0019057 | A1 | 1/2013 | Stephens |
| 2013/0047044 | A1 | 2/2013 | Weathers et al. |
| 2013/0094286 | A1 | 4/2013 | Sridharan et al. |
| 2013/0151214 | A1 | 6/2013 | Ryou |
| 2013/0176784 | A1 | 7/2013 | Cometti et al. |
| 2013/0185487 | A1 | 7/2013 | Kim et al. |
| 2013/0227200 | A1 | 8/2013 | Cometti et al. |
| 2013/0311712 | A1 | 11/2013 | Aso |
| 2014/0006688 | A1 | 1/2014 | Yu et al. |
| 2014/0101499 | A1 | 4/2014 | Griffin |
| 2014/0181378 | A1 | 6/2014 | Saeki et al. |
| 2014/0181595 | A1 | 6/2014 | Hoang et al. |
| 2014/0195725 | A1 | 7/2014 | Bennett |
| 2014/0208174 | A1 | 7/2014 | Ellis et al. |
| 2014/0215129 | A1 | 7/2014 | Kuzmin et al. |
| 2014/0229799 | A1 | 8/2014 | Hubris et al. |
| 2014/0293699 | A1 | 10/2014 | Yang et al. |
| 2014/0347936 | A1 | 11/2014 | Ghaly |
| 2014/0359202 | A1 | 12/2014 | Sun et al. |
| 2014/0365836 | A1 | 12/2014 | Jeon et al. |
| 2015/0078094 | A1 | 3/2015 | Nagashima |
| 2015/0082121 | A1 | 3/2015 | Wu et al. |
| 2015/0227418 | A1 | 8/2015 | Cai et al. |
| 2015/0357045 | A1* | 12/2015 | Moschiano ......... G06F 11/1048 714/720 |
| 2016/0004464 | A1 | 1/2016 | Shen |
| 2016/0092304 | A1 | 3/2016 | Tabrizi et al. |
| 2016/0093397 | A1 | 3/2016 | Tabrizi et al. |
| 2016/0148708 | A1* | 5/2016 | Tuers ................ G11C 29/38 714/719 |
| 2016/0170682 | A1* | 6/2016 | Bakshi ................ G06F 3/0649 711/103 |
| 2016/0306591 | A1 | 10/2016 | Ellis et al. |
| 2016/0342345 | A1 | 11/2016 | Kankani et al. |
| 2017/0090783 | A1* | 3/2017 | Fukutomi ............. G06F 3/0616 |
| 2017/0109040 | A1 | 4/2017 | Raghu et al. |
| 2017/0228180 | A1 | 8/2017 | Shen |
| 2017/0235486 | A1 | 8/2017 | Martineau et al. |
| 2017/0262336 | A1 | 9/2017 | Tabrizi et al. |
| 2017/0315753 | A1 | 11/2017 | Blount |
| 2018/0018269 | A1 | 1/2018 | Jannyavula Venkata et al. |
| 2018/0032439 | A1 | 2/2018 | Jenne et al. |
| 2018/0034476 | A1 | 2/2018 | Kayser et al. |
| 2018/0039795 | A1 | 2/2018 | Gulati |
| 2018/0060230 | A1 | 3/2018 | Kankani et al. |

FOREIGN PATENT DOCUMENTS

| | | |
|---|---|---|
| JP | 2011-100519 A | 5/2011 |
| JP | 2012-203957 A | 10/2012 |
| JP | 2013176784 A | 9/2013 |

OTHER PUBLICATIONS

Te-Hsuan Chen et al.; "An Adaptive-Rate Error Correction Scheme for NAND Flash Memory"; 27th IEEE VLSI Test Symposium; pp. 53-58; 2009 (6 pages).

Eran Gal et al.; "Algorithms and Data Structures for Flash Memories"; ACM Computing Surveys (CSUR); vol. 37, No. 2; pp. 138-163; Jun. 2005 (30 pages).

Mendel Rosenblum et al.; "The Design and Implementation of a Log-Structured File System"; ACM Transactions on Computer Systems; vol. 10; No. 1; pp. 26-52; Feb. 1992 (27 pages).

Chanik Park et al.; "A Reconfigurable FTL (Flash Translation Layer) Architecture for NAND Flash-Based Applications"; ACM Transactions on Embedded Computing Systems; vol. 7, No. 4, Article 38; Jul. 2008 (23 pages).

Yu Cai et al.; "Flash Correct-and-Refresh: Retention-Aware Error Management for Increased Flash Memory Lifetime"; Proceedings of the IEEE International Conference on Computer Design (ICCD); pp. 94-101; 2012 (10 pages).

Beomkyu Shin et al.; "Error Control Coding and Signal Processing for Flash Memories"; IEEE International Symposium on Circuits and Systems (ISCAS); pp. 409-412; 2012 (4 pages).

Haleh Tabrizi et al.; "A Learning-based Network Selection Method in Heterogeneous Wireless Systems"; IEEE Global Telecommunications Conference (GLOBECOM 2011); 2011 (5 pages).

Neal Mielke et al.; "Recovery Effects in the Distributed Cycling of Flash Memories"; IEEE 44th Annual International Reliability Physics Symposium; pp. 29-35; 2006 (7 pages).

Ramesh Pyndiah et al.; "Near Optimum Decoding of Product Codes"; Global Telecommunicaitons Conference (GLOBECOM '94), Communications: The Global Bridge pp. 339-343; 1994 (5 pages).

Junsheng Han et al.; "Reliable Memories with Subline Accesses"; International Symposium on Information Theory (ISIT); pp. 2531-2535, Jun. 2007 (5 pages).

Ankit Singh Rawat et al.; "Locality and Availability in Distributed Storage," arXiv:1402.2011v1 [cs.IT]; Feb. 10, 2014 (9 pages).

Parikshit Gopalan et al.; "On the Locality of Codeword Symbols"; arXiv:1106.3625v1[cs.IT]; Jun. 18, 2011 (17 pages).

(56) References Cited

OTHER PUBLICATIONS

Frédérique Oggier et al.; "Self-repairing Homomorphic Codes for Distributed Storage Systems"; IEEE INFOCOM 2011; pp. 1215-1223; 2011 (9 pages).

Dimitris Papailiopoulos et al.; "Simple Regenerating Codes: Network Coding for Cloud Storage"; arXiv:1109.0264v1 [cs.IT]; Sep. 1, 2011 (9 pages).

Osama Khan et al.; "In Search of I/O-Optimal Recovery from Disk Failures"; HotStorage 2011; Jun. 2011 (5 pages).

Cheng Huang et al.; "Pyramid Codes: Flexible Schemes to Trade Space for Access Efficiency in Reliable Data Storage Systems"; Sixth IEEE International Symposium on Network Computing and Applications (NCA); 2007 (8 pages).

Hongchao Zhou et al.; "Error-Correcting Schemes with Dynamic Thresholds in Nonvolatile Memories"; 2011 IEEE International Symposium on Information Theory Proceedings; pp. 2143-2147; 2011; (5 pages).

Borja Peleato et al.; "Towards Minimizing Read Time for NAND Flash"; Globecom 2012—Symposium on Selected Areas in Communication; pp. 3219-3224; 2012 (6 pages).

Yongjune Kim et al.; "Modulation Coding for Flash Memories"; 2013 International Conference on Computing, Networking and Communications, Data Storage Technology and Applications Symposium; pp. 961-967; 2013 (7 pages).

Yu Cai et al.; "Program Interference in MLC NAND Flash Memory: Characterization, Modeling, and Mitigation"; 2013 IEEE International Conference on Computer Design (ICCD); pp. 123-130; 2013 (8 pages).

Yu Cai et al.; "Threshold Voltage Distribution in MLC NAND Flash Memory: Characterization, Analysis, and Modeling"; Proceedings of the Conference on Design, Automation and Test in Europe; pp. 1285-1290; 2013 (6 pages).

Eitan Yaakobi et al.; Error Characterization and Coding Schemes for Flash Memories; IEEE Globecom 2010 Workshop on Application of Communication Theory to Emerging Memory Technologies; pp. 1856-1860; 2010 (5 pages).

Borja Peleato et al.; "Maximizing MLC NAND lifetime and reliability in the presence of write noise"; IEEE International Conference on Communications (ICC); pp. 3752-3756; 2012 (5 pages).

Feng Chen et al.; "Essential Roles of Exploiting Internal Parallelism of Flash Memory based Solid State Drives in High-Speed Data Processing"; 2011 IEEE 17th International Symposium on High Performance Computer Architecture (HPCA); pp. 266-277; 2011 (13 pages).

* cited by examiner

METHOD AND SYSTEM FOR ONLINE PROGRAM/ERASE COUNT ESTIMATION

BACKGROUND

Solid state storage generally corresponds to any type of storage that has a finite number of program-erase cycles. The limited number of program-erase cycles or write cycles necessitates the use of methods to avoid excessive writes to the same region of the solid state storage in order to prevent data loss. In order to maximize the use of the solid state storage, storage systems using solid state storage include mechanisms to track the number of program-erase cycles performed on the various regions of the solid state storage. Meanwhile, the characteristics of storage elements change as program-erase cycles increase so that the optimality of various parameters for storage elements depends on the program-erase cycles information available in the solid-state storage system. The sub optimality of storage element parameters due to any absence or inaccuracy of program-erase cycles information may result in increased latency, decreased throughput, or data loss.

DETAILED DESCRIPTION

Specific embodiments of the technology will now be described in detail with reference to the accompanying figures. In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description In the following description of FIGS. 1-6, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment which may be implemented in addition to, in conjunction with, or in place of the embodiments described with regard to a corresponding like-named component in any other figure.

In general, embodiments of the technology relate to determining a P/E cycle value for an online storage module when the currently stored P/E cycle value is not present or is outside the expected P/E cycle value range. The calculated P/E cycle value may then be used to improve the accuracy of wear-level operations so that it may prevent the condition that a small population of storage elements reach the end of life significantly earlier than the majority of storage elements or it may prevent uneven performance degradation over storage elements. The performance of the system may also be improved by using the calculated P/E cycle value to improve the servicing of read requests. For example, the calculated P/E cycle value may be used with, retention times, and page numbers in order to determine the appropriate read threshold value(s) to use when reading data that has been previously stored in the solid-state storage. The ability to dynamically change the read threshold values on a per-read request basis allows for more error-free data to be retrieved from the solid-state storage. When error-free data is retrieved from the solid-state storage, there is no need to implement error correction mechanisms. As a result, the performance of the system increases.

The following description describes one or more systems and methods for implementing one or more embodiments of the technology.

Figure 1A:
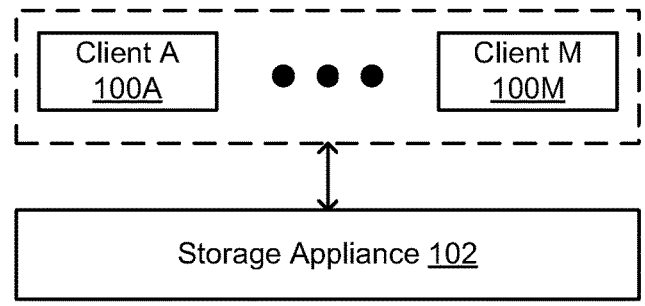
FIGS. 1A-1C show systems in accordance with one or more embodiments of the technology.
Figure 1B:
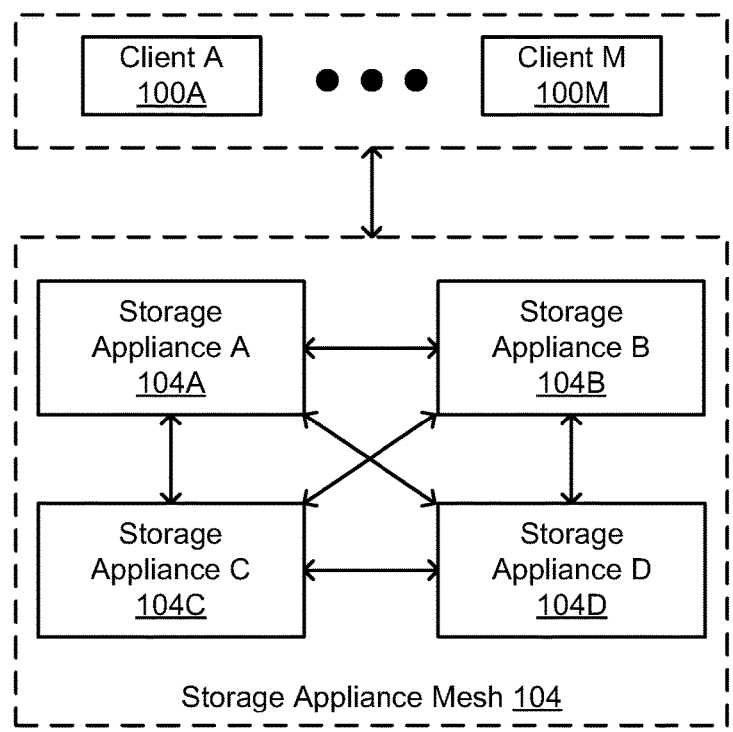
Figure 1C:
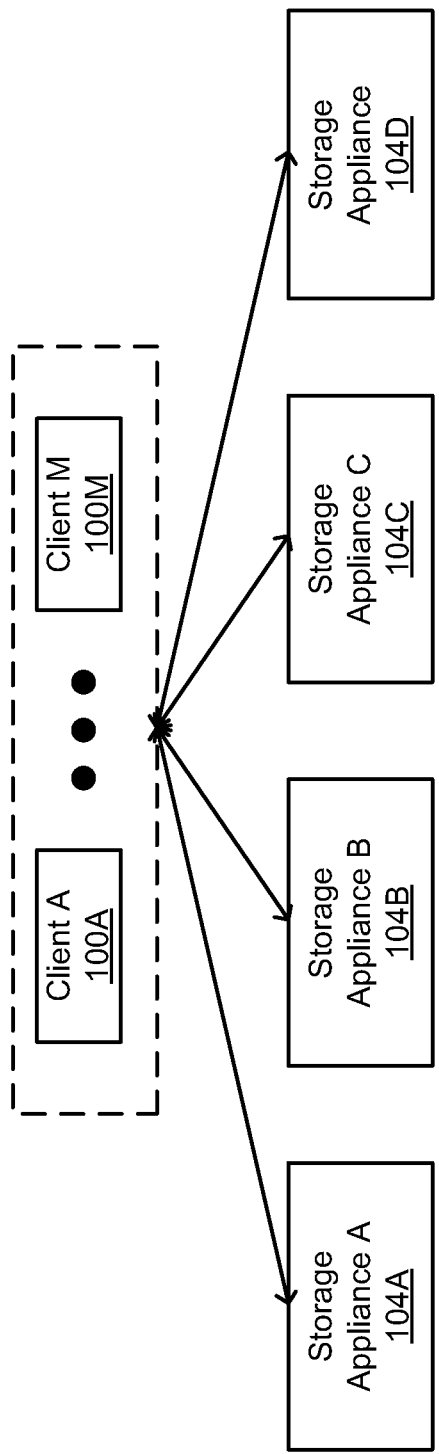

FIGS. 1A-1C show systems in accordance with one or more embodiments of the technology. Referring to FIG. 1A, the system includes one or more clients (client A (100A), client M (100M)) operatively connected to a storage appliance (102).

In one embodiment of the technology, clients (100A, 100M) correspond to any physical system that includes functionality to issue a read request to the storage appliance (102) and/or issue a write request to the storage appliance (102). Though not shown in FIG. 1A, each of the clients (100A, 100M) may include a client processor (not shown), client memory (not shown), and any other software and/or hardware necessary to implement one or more embodiments of the technology.

In one embodiment of the technology, the client (100A-100M) is configured to execute an operating system (OS) that includes a file system. The file system provides a mechanism for the storage and retrieval of files from the storage appliance (102). More specifically, the file system includes functionality to perform the necessary actions to issue read requests and write requests to the storage appliance. The file system also provides programming interfaces to enable the creation and deletion of files, reading and writing of files, performing seeks within a file, creating and deleting directories, managing directory contents, etc. In addition, the file system also provides management interfaces to create and delete file systems. In one embodiment of the technology, to access a file, the operating system (via the file system) typically provides file manipulation interfaces to open, close, read, and write the data within each file and/or to manipulate the corresponding metadata.

Continuing with the discussion of FIG. 1A, in one embodiment of the technology, the clients (100A, 100M) are configured to communicate with the storage appliance (102) using one or more of the following protocols: Peripheral Component Interconnect (PCI), PCI-Express (PCIe), PCI-eXtended (PCI-X), Non-Volatile Memory Express (NVMe), Non-Volatile Memory Express (NVMe) over a PCI-Express fabric, Non-Volatile Memory Express (NVMe) over an Ethernet fabric, and Non-Volatile Memory Express (NVMe) over an Infiniband fabric. Those skilled in the art will appreciate that the technology is not limited to the aforementioned protocols.

In one embodiment of the technology, the storage appliance (102) is a system that includes volatile and persistent storage and is configured to service read requests and/or write requests from one or more clients (100A, 100M). Various embodiments of the storage appliance (102) are described below in FIG. 2.

Referring to FIG. 1B, FIG. 1B shows a system in which clients (100A, 100M) are connected to multiple storage appliances (104A, 104B, 104C, 104D) arranged in a mesh configuration (denoted as storage appliance mesh (104) in FIG. 1B). As shown in FIG. 1B, the storage appliance mesh (104) is shown in a fully-connected mesh configuration—that is, every storage appliance (104A, 104B, 104C, 104D) in the storage appliance mesh (104) is directly connected to every other storage appliance (104A, 104B, 104C, 104D) in the storage appliance mesh (104). In one embodiment of the technology, each of the clients (100A, 100M) may be directly connected to one or more storage appliances (104A, 104B, 104C, 104D) in the storage appliance mesh (104). Those skilled in the art will appreciate that the storage appliance mesh may be implemented using other mesh configurations (e.g., partially connected mesh) without departing from the technology.

Referring to FIG. 1C, FIG. 1C shows a system in which clients (100A, 100M) are connected to multiple storage appliances (104A, 104B, 104C, 104D) arranged in a fan-out configuration. In this configuration, each client (100A, 100M) is connected to one or more of the storage appliances (104A, 104B, 104C, 104D); however, there is no communication between the individual storage appliances (104A, 104B, 104C, 104D).

Those skilled in the art will appreciate that while FIGS. 1A-1C show storage appliances connected to a limited number of clients, the storage appliances may be connected to any number of clients without departing from the technology. Those skilled in the art will appreciate that while FIGS. 1A-1C show various system configurations, the technology is not limited to the aforementioned system configurations. Further, those skilled in the art will appreciate that the clients (regardless of the configuration of the system) may be connected to the storage appliance(s) using any other physical connection without departing from the technology.

Figure 2:
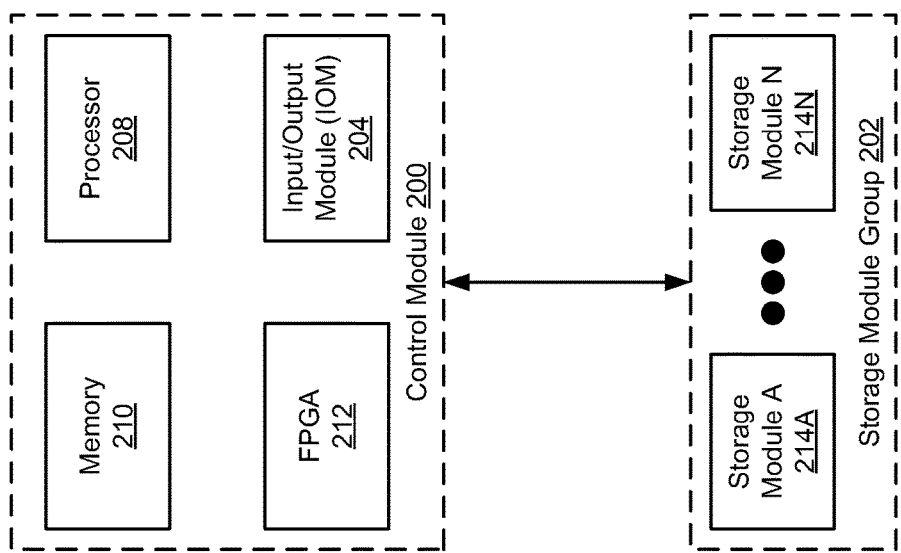
FIG. 2 shows storage appliances in accordance with one or more embodiments of the technology.

FIG. 2 shows embodiments of a storage appliance in accordance with one or more embodiments of the technology. The storage appliance includes a control module (200) and a storage module group (202). Each of these components is described below. In general, the control module (200) is configured to manage the servicing of read and write requests from one or more clients. In particular, the control module is configured to receive requests from one or more clients via the IOM (discussed below), to process the request (which may include sending the request to the storage module), and to provide a response to the client after the request has been serviced. Additional details about the components in the control module are included below. Further, the operation of the control module with respect to calculating P/E cycle values is described below in FIG. 5A and the operation of the control module with respect to servicing read requests is described below with reference to FIGS. 5B-5C.

Continuing with the discussion of FIG. 2, in one embodiment of the technology, the control module (200) includes an Input/Output Module (IOM) (204), a processor (208), a memory (210), and, optionally, a Field Programmable Gate Array (FPGA) (212). In one embodiment of the technology, the IOM (204) is the physical interface between the clients (e.g., 100A, 100M in FIGS. 1A-1C) and the other components in the storage appliance. The IOM supports one or more of the following protocols: PCI, PCIe, PCI-X, Ethernet (including, but not limited to, the various standards defined under the IEEE 802.3a-802.3bj), Infiniband, and Remote Direct Memory Access (RDMA) over Converged Ethernet (RoCE). Those skilled in the art will appreciate that the IOM may be implemented using protocols other than those listed above without departing from the technology.

Continuing with FIG. 2, the processor (208) is a group of electronic circuits with a single core or multi-cores that are configured to execute instructions. In one embodiment of the technology, the processor (208) may be implemented using a Complex Instruction Set (CISC) Architecture or a Reduced Instruction Set (RISC) Architecture. In one or more embodiments of the technology, the processor (208) includes a root complex (as defined by the PCIe protocol). In one embodiment of the technology, if the control module (200) includes a root complex (which may be integrated into the processor (208)) then the memory (210) is connected to the processor (208) via the root complex. Alternatively, the memory (210) is directly connected to the processor (208) using another point-to-point connection mechanism. In one embodiment of the technology, the memory (210) corresponds to any volatile memory including, but not limited to, Dynamic Random-Access Memory (DRAM), Synchronous DRAM, SDR SDRAM, and DDR SDRAM.

In one embodiment of the technology, the processor (208) is configured to create and update an in-memory data structure (not shown), where the in-memory data structure is stored in the memory (210). In one embodiment of the technology, the in-memory data structure includes information described in FIG. 4.

In one embodiment of the technology, if an FGPA (212) is present, the processor is configured to offload various types of processing to the FPGA (212). More specifically, the processor may offload all or a portion of its processing to the FPGA (212). In one embodiment of the technology, the storage module group (202) includes one or more storage modules (214A, 214N) each configured to store data. One embodiment of a storage module is described below in FIG. 3.

Figure 3:
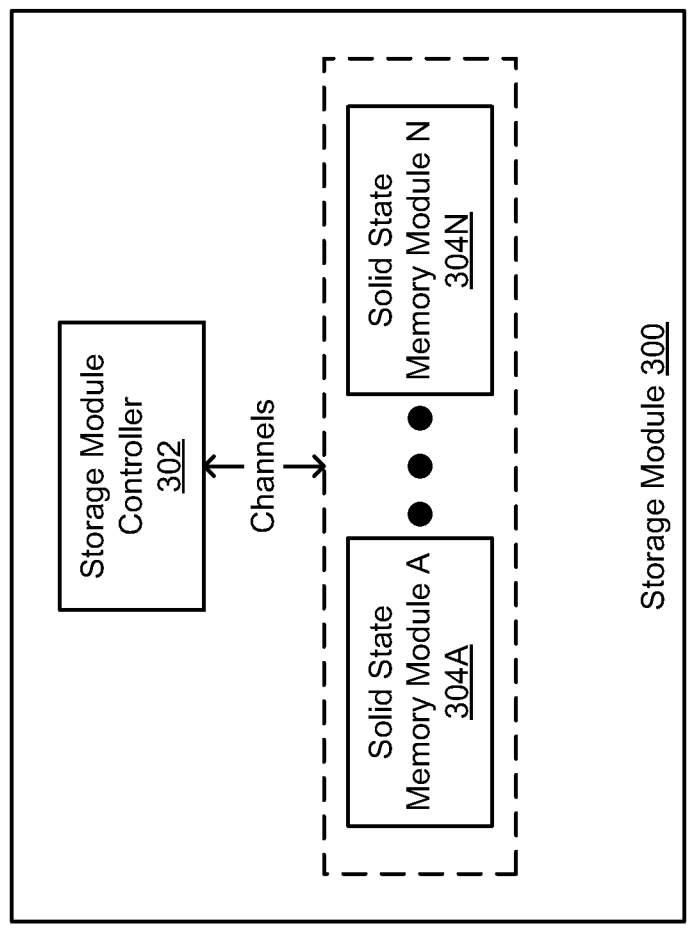
FIG. 3 shows a storage module in accordance with one or more embodiments of the technology.

FIG. 3 shows a storage module in accordance with one or more embodiments of the technology. The storage module (300) includes a storage module controller (302), memory (not shown), and one or more solid-state memory modules (304A, 304N). Each of these components is described below.

In one embodiment of the technology, the storage module controller (300) is configured to receive requests read and/or write requests from the control module. Further, the storage module controller (300) is configured to service the read and write requests using the memory (not shown) and/or the solid-state memory modules (304A, 304N).

In one embodiment of the technology, the memory (not shown) corresponds to any volatile memory including, but not limited to, Dynamic Random-Access Memory (DRAM), Synchronous DRAM, SDR SDRAM, and DDR SDRAM.

In one embodiment of the technology, the solid-state memory modules correspond to any data storage device that uses solid-state memory to store persistent data. The solid-state memory may include, but is not limited to, Spin-Torque Magnetic RAM (ST-MRAM), write in-place persistent storage, Phase Change Memory (PCM), NAND Flash memory and NOR Flash memory. Further, the NAND Flash memory and the NOR flash memory may include single-level cells (SLCs), multi-level cell (MLCs), or triple-level cells (TLCs). Generally, the solid-state memory may correspond to any type of memory that has a finite number of program-erase cycles. Those skilled in the art will appreciate that embodiments of the technology are not limited to storage class memory.

Figure 4:
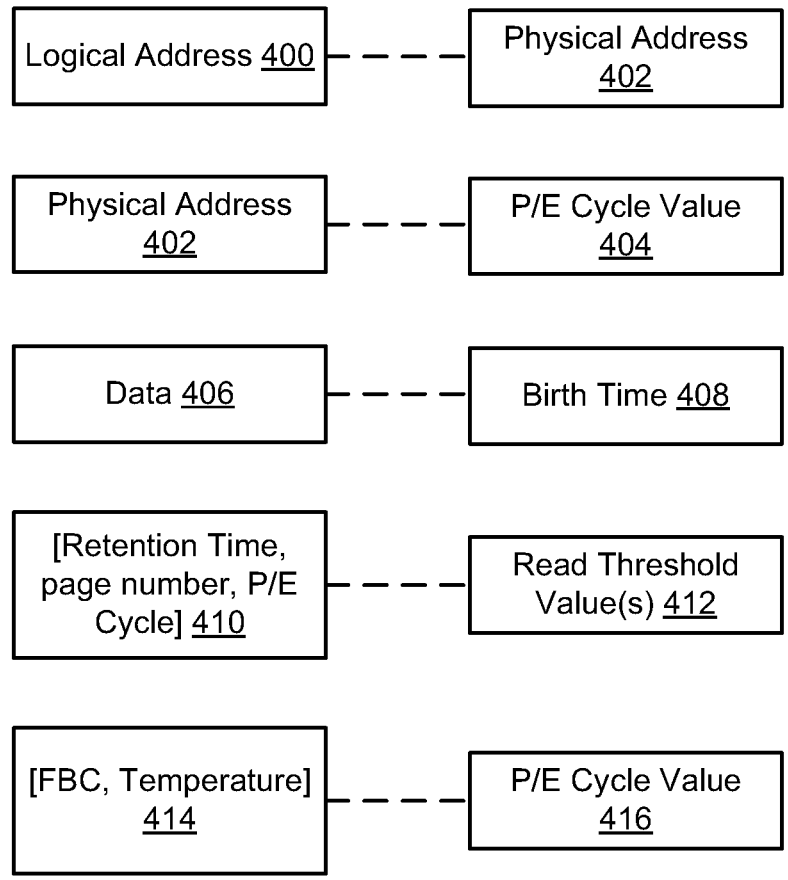
FIG. 4 shows the relationship between various components in accordance with one or more embodiments of the technology.

FIG. 4 shows the relationship between various components in accordance with one or more embodiments of the technology. More specifically, FIG. 4 shows the various types of information that is stored in the memory of the control module. Further, the control module includes functionality to update the information stored in the memory of the control module. The information described below may be stored in one or more in-memory data structures. Further, any data structure type (e.g., arrays, linked lists, hash tables, etc.) may be used to organize the following information within the in-memory data structure(s) provided that the data structure type(s) maintains the relationships (as described below) between the information.

The memory includes a mapping of logical addresses (400) to physical addresses (402). In one embodiment of the technology, the logical address (400) is an address at which the data appears to reside from the perspective of the client (e.g., 100A, 100M in FIG. 1A). Said another way, the logical address (400) corresponds to the address that is used by the file system on the client when issuing a read request to the storage appliance.

In one embodiment of the technology, the logical address is (or includes) a hash value generated by applying a hash function (e.g., SHA-1, MD-5, etc.) to an n-tuple, where the n-tuple is <object ID, offset ID>. In one embodiment of the technology, the object ID defines a file and the offset ID defines a location relative to the starting address of the file. In another embodiment of the technology, the n-tuple is <object ID, offset ID, birth time>, where the birth time corresponds to the time when the file (identified using the object ID) was created. Alternatively, the logical address may include a logical object ID and a logical byte address, or a logical object ID and a logical address offset. In another embodiment of the technology, the logical address includes an object ID and an offset ID. Those skilled in the art will appreciate that multiple logical addresses may be mapped to a single physical address and that the logical address content and/or format is not limited to the above embodiments.

In one embodiment of the technology, the physical address (402) corresponds to a physical location in a solid-state memory module (304A, 304N) in FIG. 3. In one embodiment of the technology, the physical address is defined as the following n-tuple: <storage module, channel, chip enable, LUN (or die), plane, block, page number, byte>.

In one embodiment of the technology, each physical address (402) is associated with a program/erase (P/E) cycle value (404). The P/E cycle value may represent: (i) the number of P/E cycles that have been performed on the physical location defined by the physical address or (ii) a P/E cycle range (e.g., 5,000-9,999 P/E cycles), where the number of P/E cycles that have been performed on the physical location defined by the physical address is within the P/E cycle range. In one embodiment of the technology, a P/E cycle is the writing of data to one or more pages in an erase block (i.e., the smallest addressable unit for erase operations, typically, a set of multiple pages) and the erasure of that block, in either order.

The P/E cycle values may be stored on a per page basis, a per block basis, on a per set of blocks basis, and/or at any other level of granularity. The control module includes functionality to update, as appropriate, the P/E cycle values (404) when data is written to (and/or erased from) the solid-state storage modules.

Figure 5A:
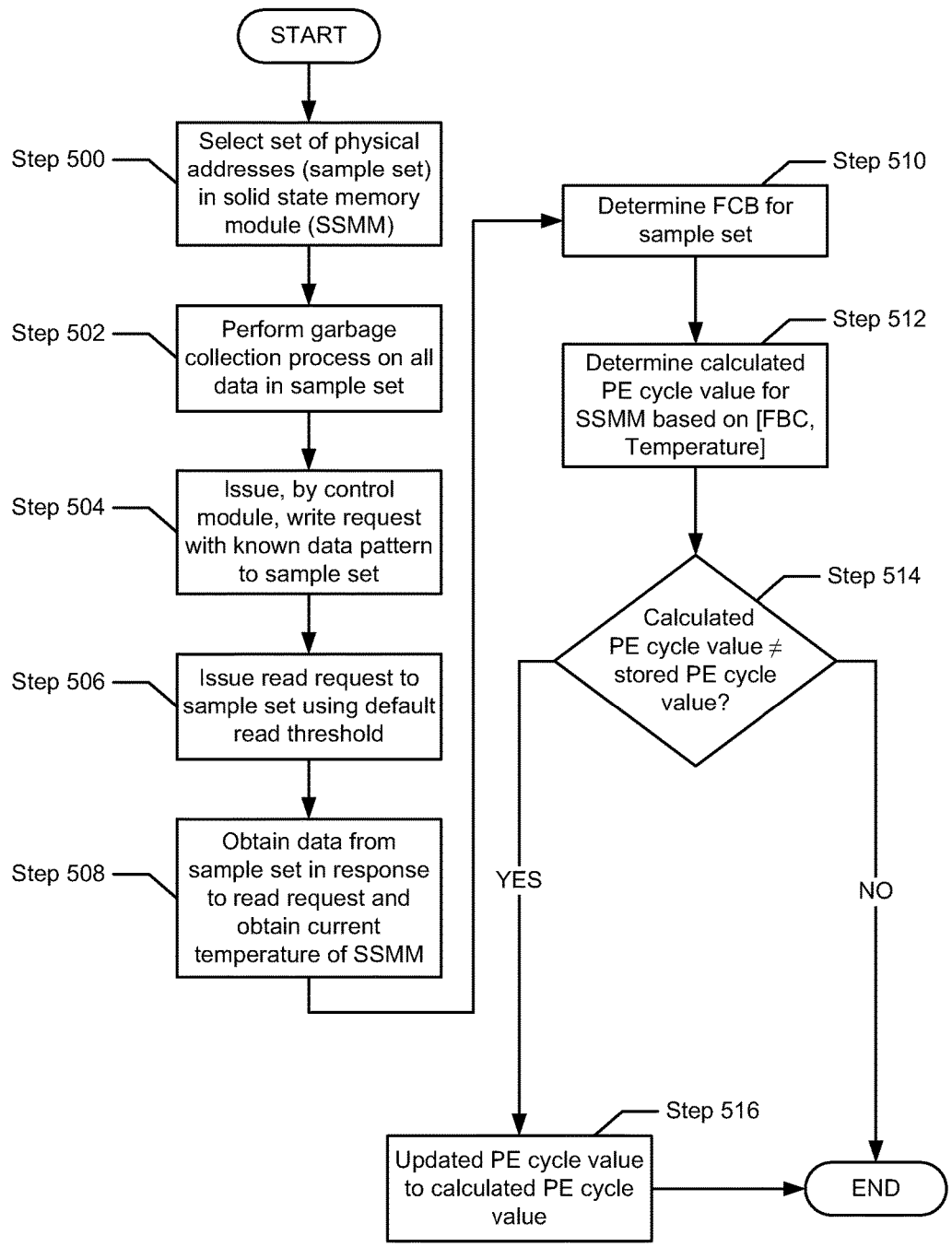
FIG. 5A shows a method for method for estimating a Program/Erase (P/E) cycle value for an online storage module in accordance with one or more embodiments of the technology.

In one embodiment of the technology, the P/E cycle value (404) may be updated in accordance with the method shown in FIG. 5A. In such scenarios, after the P/E cycle value (404) is updated to correspond to the calculated P/E cycle value (404), the calculated P/E cycle value (404) may be updated by the controller when to reflect subsequent P/E cycles occur.

For example, consider a scenario in which the P/E cycle value (404) for a given physical address is currently set at 1000. The method in FIG. 5A is then performed and the calculated P/E cycle value is 1500. Accordingly, the P/E cycle value (404) is updated to 1500. After the updating, the controller performs five P/E cycles at the physical address. The P/E cycle value (404) is then updated to 1505.

Continuing with the discussion of FIG. 4, in one embodiment of the technology, all data (i.e., data that the file system on the client has requested be written to solid-state storage modules) (406) is associated with a birth time (408). The birth time (408) may correspond to: (i) the time the data is written to a physical location in a solid-state storage module (as a result of client write request, as a result of a garbage collection operation initiated by the control module, etc.); (ii) the time that the client issued a write request to write the data to a solid-state storage module; or (iii) a unitless value (e.g., a sequence number) that corresponds to the write events in (i) or (ii).

In one embodiment of the technology, the in-memory data structure includes a mapping of <retention time, page number, P/E cycle value> to one or more read threshold value (412). The aforementioned mapping may further include any other system parameter(s) (i.e., one or more parameters in addition to retention time, page number, P/E cycle value) that affects the read threshold (e.g., temperature, workload, etc.). In one embodiment of the technology, the retention time corresponds to the time that has elapsed between the writing of the data to a physical location in a solid-state storage module and the time that the data is being read from the same physical location in the solid-state storage module. The retention time may be expressed in units of time or may be expressed as a unitless value (e.g., when the birth time is expressed as a unitless value). In one embodiment of the technology, the P/E cycle value in <retention time, page number, P/E cycle value> may be expressed as a P/E cycle or a P/E cycle range.

In one embodiment of the technology, read threshold value(s) (412) correspond to voltages or a shift value, where the shift value corresponds to a voltage shift of a default read threshold value. Each of read threshold values may be expressed as a voltage or as a unitless number that corresponds to a voltage.

In one embodiment of the technology, the default read threshold value is specified by the manufacturer of the solid-state memory modules. Further, the granularity of the shift values may be specified by the a shift value, where the shift value corresponds to a voltage shift or a unitless shift number of a corresponding default read threshold value.

In one embodiment of the technology, the read threshold values (including the default read threshold values) correspond to voltage values that are used to read data stored in solid-state storage modules. More specifically, in one embodiment of the technology, the logical value (e.g., 1 or 0 for memory cells that are SLCs or 00, 10, 11, 01 for memory cells that are MLCs) is determined by comparing the voltage in the memory cell to one or more read threshold values. The logical value stored in the memory cell may then be ascertained based the results of the comparison. For example, if a given voltage (V) is above a B threshold and below a C threshold, then the logical value stored in the memory cell is 00. In one embodiment of the technology, each page in the solid-state memory module may include between 4-8K of data. Accordingly, the storage module controller typically obtains logical values from multiple memory cells in order to service a read request. The specific number of memory cells from which logical values must be obtained varies based upon the amount of data that is being requested (via the read request) and the type of memory cell (SLC, MLC, etc.).

In one embodiment of the technology, the read threshold value(s) (412) are ascertained by conducting experiments to determine how the read threshold values should be modified when at least one of the following variables is modified: retention time, P/E cycle value, and page number. The read threshold value(s) (412) is optimized in order to be able to successfully read data from a solid-state memory module. Specifically, for each combination of <retention time, P/E cycle value, page number> an optimal read threshold value is determined. The optimal read threshold value for a given <retention time, P/E cycle value, page number> is the read threshold value that results in the lowest bit error rate (BER) in data retrieved from a solid-state memory module for a given retention time of the data, P/E cycle value of the physical location on which the data is stored, and the page number of the page on which the data is stored in the solid-state memory module.

By modifying the read threshold value(s) based upon retention time, P/E cycle value, and page number, the storage appliance takes into account the various variables that may alter the voltage stored in a given memory cell at a given retention time, P/E cycle value, and page number. Said another way, when the logical value "01" is to be stored in a memory cell, the storage module controller stores a sufficient number of electrons in the memory cell in order to have a voltage that corresponds to "01". Over time, the voltage stored in the memory cell varies based upon the retention time, P/E cycle value, and page number. By understanding how the voltage varies over time based on the above variables, an appropriate read threshold value may be used when reading the logical value from the memory cell in order to retrieve "01".

For example, a first read threshold value(s) may be used to successfully read data when the retention time is 4 months, the P/E cycle value is 30,000, and the page number is 3, while a second read threshold value(s) may be used to successfully read data when the retention time is 5 months, the P/E cycle value is 30,000, and the page number is 3.

If the default read threshold value is used (instead of a non-default read threshold value), then there is a higher likelihood that an incorrect logical value (e.g., "11" instead of "01") may be obtained from reading the memory cell. This, in turn, results in the need for error correction mechanisms such as read retries, read commands requiring longer latencies, soft decoding, or RAID reconstruction (i.e., correction of errors within retrieved data using one or more parity values) in order to correct the error in the retrieve data and ultimately provide error-free data to the requesting client. The need for such extra error correction mechanisms not only increases the time required to service a client read request and consequently decreases the performance of the storage appliance but also potentially results in data loss.

In one embodiment of the technology, a read threshold value(s) may be provided for each <retention time, P/E cycle value, and page number> combination. The specific read threshold value(s) for a given <retention time, P/E cycle value, and page number> may correspond to the default read threshold value(s) or a non-default read threshold value(s) (i.e., a read threshold value other than the default read threshold value(s)).

In another embodiment of the technology, memory (210 in FIG. 2) only stores a non-default read threshold value(s) for each <retention time, P/E cycle value, and page number> combination that is associated with a non-default read threshold value(s). In this scenario, a non-default read threshold value is associated with a given <retention time, P/E cycle value, and page number> combination when using the non-default read threshold value results in a higher percentage of error-free data being read from the solid-state memory module versus using the default read threshold value(s). Further, in this scenario, no default read threshold value(s) is stored for any <retention time, P/E cycle value, and page number> combination when using the default read threshold value(s) results in a higher percentage of error-free data being read from the solid-state memory module versus using the non-default read threshold value(s).

In one embodiment of the technology, the in-memory data structure includes a mapping of <failed bit count (FBC), temperature> to P/E cycle value (416). The FBC may represent the number of bits that are incorrect in data, typically in an Error Correcting Code (ECC) codeword (also referred to as a codeword), that is read from the storage module. The FBC may be obtained as output of an ECC decoder (located in the storage module controller) when the ECC decoding operation is successful. The mean FBC may be calculated over a sample of ECC codewords. In one embodiment, the mean FBC is obtained as the mean of FBCs from all the pages of a block or a group of blocks whose P/E cycles is to be estimated. Without departing from the technology, other sampling and averaging methods may be used. In one embodiment, the mean FBC is obtained as the mean of FBCs from predefined sample pages of a block or a group of blocks whose P/E cycles is to be estimated. The mean FBC may be represented as a specific value or as a range. In one embodiment, the aforementioned mapping may not include temperature. For example, the mapping may be a mapping between <FBC> and <PIE cycle value>. While the above mapping uses mean FBC, other measures of error rate for data read from the storage modules may be used without departing from the technology.

In one embodiment of the technology, in place of FBC, syndrome weight from LDPC (low-density parity-check) decoder output may be used. Syndrome weight is the number of failed parity check equations during the ECC decoding. Syndrome weight of ECCs with sparse parity check matrices such as LDPC codes may be used in place of FBC. In one embodiment of the technology, in place of FBC, decoding latency may be used. In ECC decoders such as BCH (Bose-Chaudhury-Hocquenghem) decoder or LDPC decoder, the decoding latency increases as FBC corrected by the decoder increases.

In one embodiment of the technology, the <FBC, Temperature> to <P/E cycle value> mappings are ascertained by conducting experiments to determine the FBC for specific combinations of temperature and known P/E cycle values.

For example, data, with a known pattern, may be read from a solid-state memory module with a known P/E cycle value at a particular temperature. The resulting FBC from the read data may then be used to generate the <FBC, Temperature> to P/E cycle value mapping. A similar method may be used to determine <FBC> to <P/E cycle value> mappings without departing from the technology.

Turning to the flowcharts, while the various Steps in the flowchart are presented and described sequentially, one of ordinary skill will appreciate that some or all of the Steps may be executed in different orders, may be combined or omitted, and some or all of the steps may be executed in parallel.

FIG. 5A shows a method for estimating a PE cycle value for an online storage module in accordance with one or more embodiments of the technology. The method shown in FIG. 5A may be performed by the control module. Further, the method shown in FIG. 5A may be performed periodically, may be performed when a P/E cycle value anomaly is detected, may be performed upon request by a user of the storage application or a third-party, or may be performed any other time.

In one embodiment of the technology, a P/E cycle value anomaly may be detected when the P/E cycle value for a given region (e.g., set of blocks) in a solid state memory module is: (i) not present (i.e., there is no P/E cycle value available in the in-memory data structure or in the solid state memory module in which the region is located) or (ii) the P/E cycle value for the given region is outside the expected range of P/E cycle values for the region. The P/E cycle value may be outside the expected range when the P/E cycle value for other regions in the solid state memory module have a P/E cycle value that is more than 10%-15% different than the P/E cycle value for the given region. For example, if the P/E cycle value for a region is 10000 and the P/E cycle value for other regions in the same solid state memory module is 15000, then a P/E cycle value anomaly may be detected. Those skilled in the art that the anomaly threshold is not limited to 10-15%; rather, the anomaly threshold may be configured with different values. Further, the anomaly thresholds may be set on a per-storage appliance basis, on a per-solid state memory module basis, on a per-solid state memory type basis, or using any other level of granularity Turning to FIG. 5A, in step 500, a set of physical addresses (sample set) in a solid state memory module (SSMM) is selected. The set of physical addresses may correspond to physical addresses within the region of the SSMM for which the P/E cycle value needs to be calculated. If the P/E cycle value is to be calculated for the entire SSMM, then the sample set may correspond to a representative set of physical addresses across the SSMM. The sample set may correspond to a set of contiguous or non-contiguous physical addresses.

In step 502, garbage collection is performed on the sample set in order to move all data currently stored in the sample set to a different physical address(es) in the SSMM or in the storage module. In one embodiment, step 502 is performed because the SSMM is online, i.e., being actively used by the storage appliance to store data and to service read requests. Through the garbage collection process, all live data (i.e., all data that is currently being used by one or more clients) is copied (or otherwise transferred) to a new physical address(es). The new physical addresses may be located in regions of the SSMM, in a different SSMM in the same storage module, or in an SSMM in a different storage module. Each of the new physical address, regardless of location, is associated with a known P/E cycle values (i.e., there are no currently known P/E cycle value anomalies for the new physical addresses). Once all the live data has been copied, any data (or copies of data) remaining in the sample set is erased. In one embodiment, step 502 may not be performed if the sample set has a status of erased.

In step 504, the control module generates and issues a write request with a known data pattern to the sample set. The result of step 504 is the writing of the data with a known data pattern to the sample set. In one embodiment, writing the data to the solid-state memory module may include generating an ECC codeword that includes the data (i.e., the data to written) and parity bits obtained using, e.g., a code generator matrix. The codeword is subsequently stored in the sample set.

In step 506, the control module subsequently generates and issues a read request to the sample set.

In step 508, the control module subsequently receives a copy of the data that is currently written to the sample set. The control module also receives the current temperature reading of the SSMM(s) in which the sample set is located. The temperature may be obtained by issuing a separate request to the storage module controller that is operatively connected to the SSMM(s) in which the sample set is located. Alternatively, the current temperature reading may be included with the response to the read request.

In step 510, the FBC for the sample set is determined. In one embodiment, the FBC may be determined by comparing the data pattern of the data received in step 508 with the known data pattern of the data written to the sample set in step 504. The comparison may be performed, by the control module, on a per-bit basis in order to determine the number of bits that are different. In another embodiment of the technology, the FBC may be determined by the ECC decoded in the storage module controller, by performing error correction on the data received in step 508, where the result of the error correction includes the number of bit errors in the data received in step 508. In scenarios in which the ECC decoder is used, the data written to the sample set does not necessarily need to be data with a known data pattern. In one embodiment, a set of data with known data patterns may be written to the sample set. In such cases, the FBC may be determined on a per-physical address basis (i.e., per-physical address in the sample set) to obtain a set of FBCs. In another embodiment of the technology, the ECC decoder may obtain a set of FBCs based on the data that is stored in sample set. The FBC that results from step 510 may then be determined as the mean or median FBC generated from the set of FBCs. The FBC may be determined using other mechanisms without departing from the technology.

In step 512, a calculated P/E cycle value is determined by performing a look-up in the in-memory data structure using the <FBC, temperature> combination, where the FBC is determined in step 510 and the temperature is obtained in step 508. In one embodiment of the technology, the FBC determined in step 510 may be mapped to an FBC range, where the FBC range instead of the specific FBC is used in the look-up performed in step 512. The result of step 512 is a calculated P/E cycle value.

In step 514, a determination is made about whether the calculated P/E cycle value is equal to the stored P/E cycle value. The stored P/E cycle value corresponds to the P/E cycle value for the physical addresses that are in the same region as the sample set. If the calculated P/E cycle value is equal to the stored P/E cycle value, then the process proceeds to step 516; otherwise, the process ends.

In step 516, the in-memory data structured is updated to include the calculated P/E cycle value as the P/E cycle value for all physical addresses in the same region as the sample set. The number of entries updated in the in-memory data structure may vary based on the region with which the sample set is associated. For example, if the sample set was only used to determine the P/E cycle value for a given set of blocks, then the number of updates may be relatively small compared to the scenario in which the sample set is used to determine the P/E cycle value for an entire SSMM.

In one embodiment of the technology, the SSMM in which the sample set is located may continue to service read and/or write requests from one or more clients while the method shown in FIG. 5A is performed.

Figure 5B:
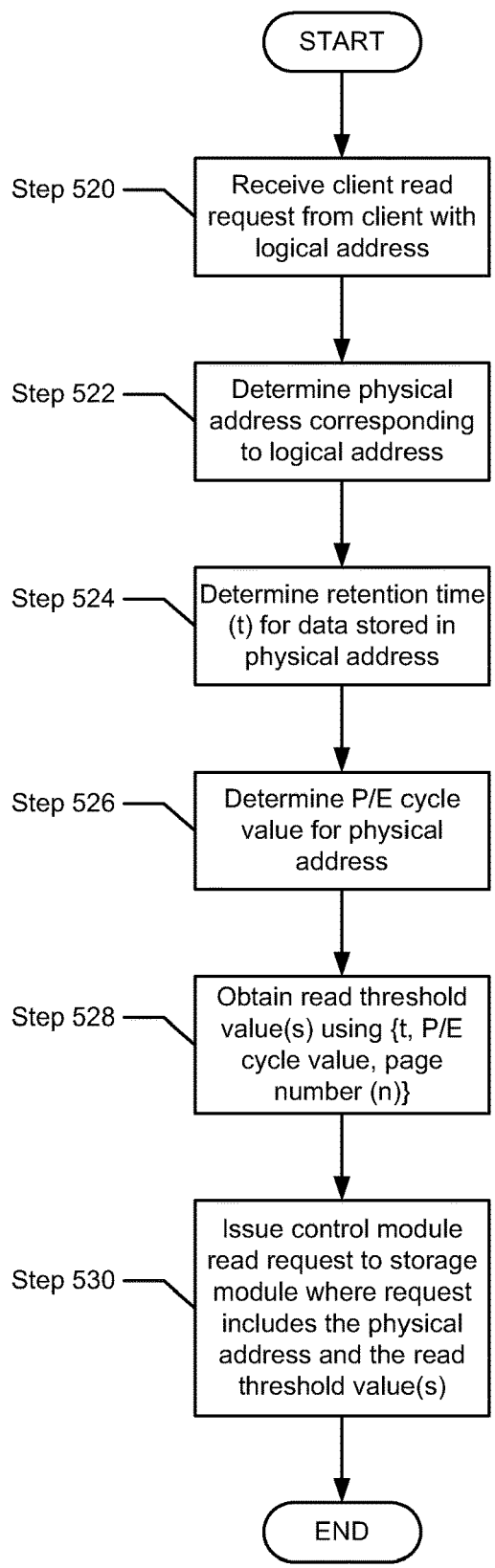
FIGS. 5B-5C show methods for reading data from a storage module in accordance with one or more embodiments of the technology.
Figure 5C:
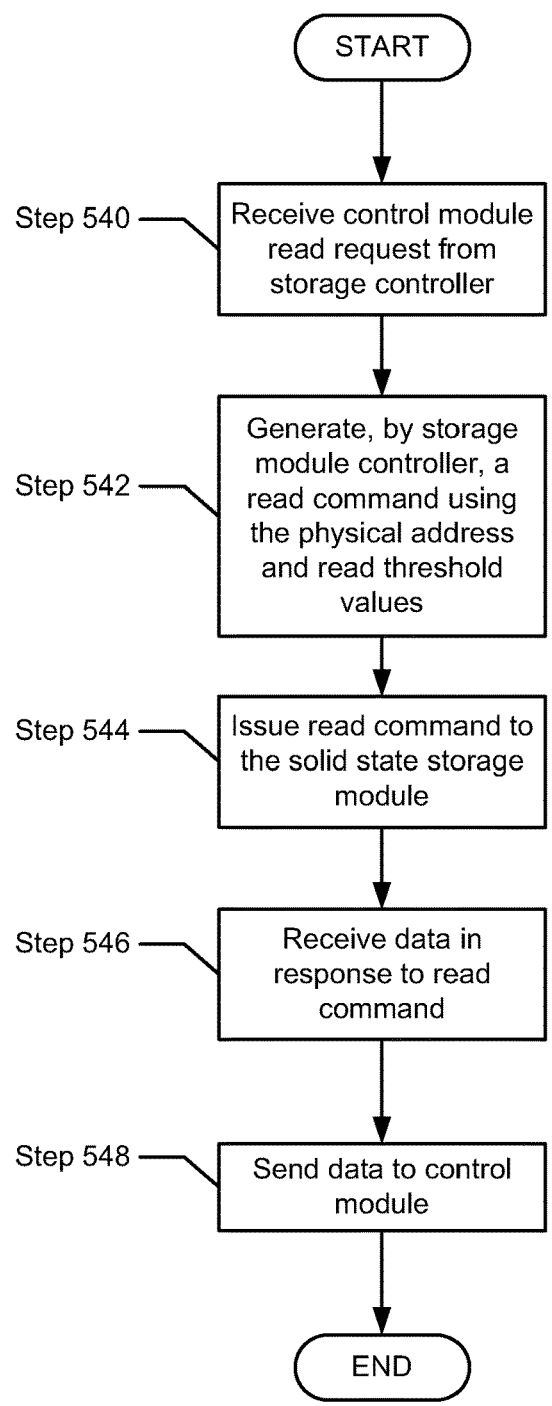

In one embodiment, the calculated P/E cycle value may be used to perform read requests as described in FIGS. 5B and 5C. Additionally, or alternatively, the calculated P/E cycle value may be used to improve wear leveling and/or garbage collection operations. Specifically, by using the correct P/E cycle value (i.e., the calculated P/E cycle value), proper wear leveling and garbage collection operations may be performed such that the solid-state memory modules are being evenly worn/used thereby extending the useful life of the solid-state storage modules.

FIG. 5B shows a method for processing client read requests by a storage appliance in accordance with one or more embodiments of the technology.

In Step 520, a client read request is received by the control module from a client, where the client read request includes a logical address.

In Step 522, a physical address (which includes the page number) is determined from the logical address. As discussed above, the memory in the control module includes a mapping of logical addresses to physical addresses (see discussion of FIG. 4, 400, 402). In one embodiment of the technology, the physical address is determined by performing a look-up (or query) using the mapping of logical addresses to physical addresses along with the logical address obtained from the client request in Step 520.

In Step 524, the retention time (t) is determined for the data stored at the physical address. The retention time may be determined using the birth time of the data (see FIG. 4, 408) and the time of the client request (e.g., the time the client issued the client request, the time the client request was received by the storage appliance, etc.). The birth time of the data is obtained from the memory (e.g., FIG. 2, 210) of the control module. The retention time may be calculated by determining the difference between the time of the client request and the birth time.

In Step 526, the P/E cycle value for the physical address is determined. The P/E cycle value may be determined by performing a look-up in an in-memory data structure (located in the memory of the control module) using the physical address as the key. The result of Step 526 may be the actual P/E cycle value associated with the physical address (e.g., the P/E cycle value associated with the block in which the physical location corresponding to the physical address is located) or may be a P/E cycle value range (e.g., 5,000-9,999 P/E cycles), where the actual P/E cycle value associated with the physical address is within the P/E cycle value range. In one embodiment of the technology, the P/E cycle value obtained in step 526 corresponds to the P/E cycle value that was updated in response to the method performed in FIG. 5A.

In Step 528, zero or more read threshold values are obtained from an in-memory data structure (see FIG. 4, 410, 412) using the following key <retention time, P/E cycle value, and page number>. In one embodiment of the technology, the result of Step 528 may be zero read threshold values when the default read threshold value(s) is to be used by the storage module controller to read data from the physical address. As discussed above, the default read threshold value(s) are used when using the default read threshold value(s) results in a higher percentage of error-free data (i.e., data with no bit errors) being read from the solid-state memory module versus using the non-default read threshold value(s). In one embodiment of the technology, one or more non-default threshold values (see FIG. 4, 412) may be obtained. As discussed above, the non-default read threshold value(s) is used when using the non-default read threshold value(s) results in a higher percentage of error-free data (i.e., data with no bit errors) being read from the solid-state memory module versus using the default read threshold value(s).

In one embodiment of the technology, the determination of whether to use a non-default read threshold value may be based on the P/E cycle value (determined in Step 526) or the retention time (determined in Step 524). For example, when the P/E cycle value is below a threshold P/E cycle value, the default read threshold value(s) is used and, as such, Step 528 is not performed. Additionally or alternatively, when the retention time is below a threshold retention time, the default read threshold value(s) is used and, as such, Step 528 is not performed. When the P/E cycle value (determined in Step 526) is above the threshold P/E cycle value and/or the retention time (determined in Step 524) is above the threshold retention time then the look-up described in Step 528 is performed.

Continuing with the discussion in FIG. 5B, in Step 530, a control module read request is generated using the one or more read threshold value(s) obtained in Step 528 and the physical address. If there are no read threshold values obtained in Step 528, the control module request may (i) include no read threshold values or (ii) may include one or more default read threshold values, where the control module obtains the default read threshold values in response to no read threshold values being obtained in Step 528. The format of the control module read request may be any format that is supported by the storage module controller.

In one embodiment of the technology, if there are multiple read threshold values associated with a given read request, then one or more of the aforementioned threshold values may correspond to the default read threshold value while other threshold values may correspond to non-default threshold values. For example, the read threshold values may be <default A read threshold value, non-default B read threshold value, default C read threshold value>. Further, in scenarios in which there are multiple read threshold values, optionally, only the non-default threshold values may be determined in Step 528. For example, the result of Step 528 may be <non-default B threshold value, non-default C threshold value>, which indicates that default A read threshold value should be used along with non-default read threshold values for thresholds B and C.

FIG. 5C shows a method for processing control module read requests in accordance with one or more embodiments of the technology. More specifically, FIG. 5C is performed by the storage module controller.

In Step 540, the control module read request is received from the control module. In Step 542, a read command is generated by the storage controller module based on the one or more read threshold value(s) and the physical address in the control module read request. In one embodiment of the technology any given read command generated in Step 542 may specify one or more read threshold values. If the control module does not include any read threshold values then the default read threshold values are used to generate the read command. If the control module read request includes read threshold values that are in the form of shift values (described above), then generating the read command may include obtaining the default read threshold values and modifying one or more read threshold values using the shift value(s). The read command may be in any format that is supported by the solid-state memory modules.

In Step 544, the read command is issued to the solid-state memory module. In Step 546, data is received, by the storage module controller, in response to the read command. In Step 548, the retrieved data is provided to the control module. The control module subsequently provides the data to the client. In one embodiment of the technology, the storage module controller may include functionality to directly transfer the retrieved data to the client without requiring the data to be temporarily stored in the memory on the control module.

Figure 6:
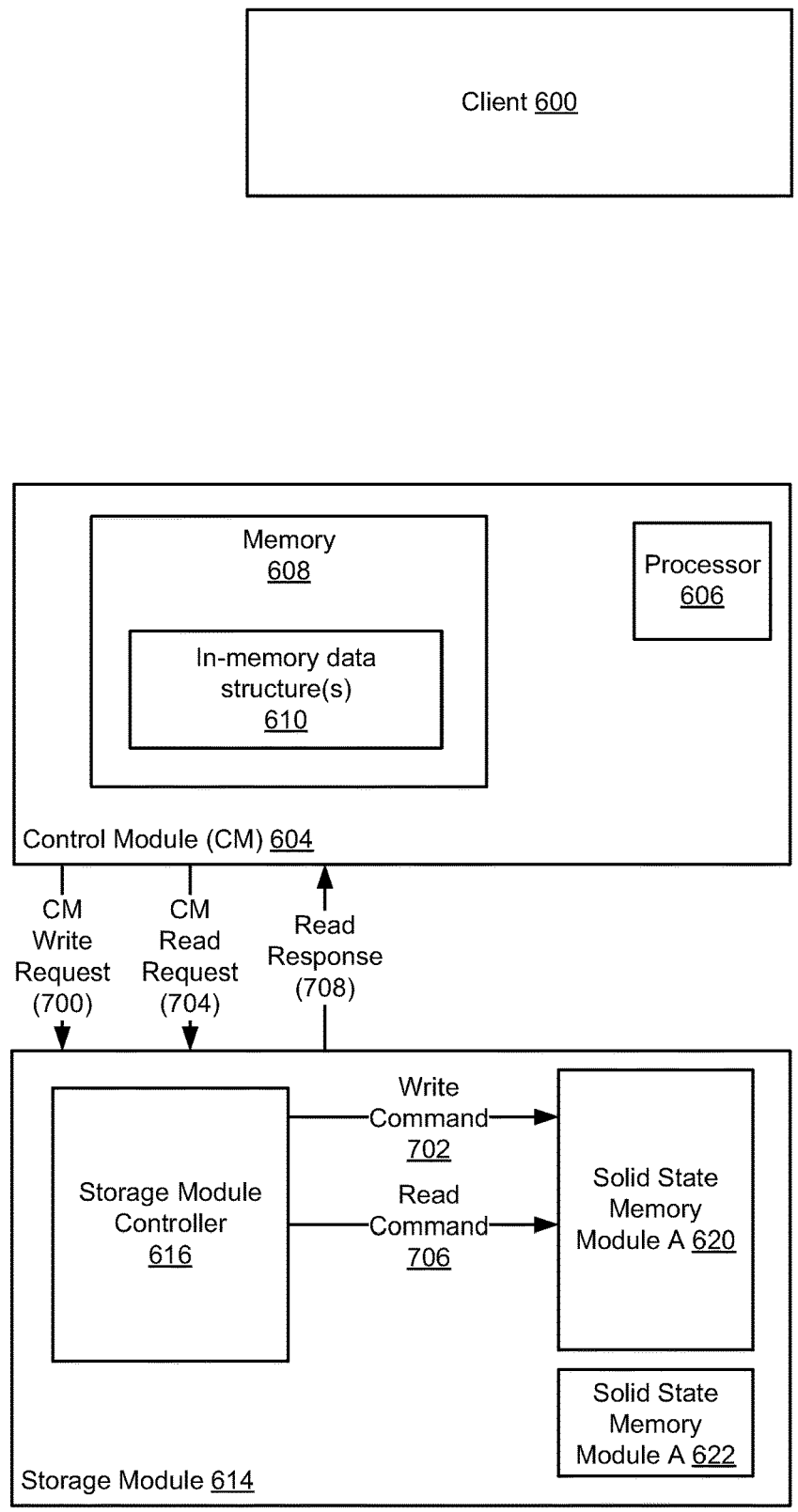
FIG. 6 shows an example in accordance with one or more embodiments of the technology.

FIG. 6 shows an example in accordance with one or more embodiments of the technology. The following example is not intended to limit the scope of the technology.

Turning to FIG. 6, consider a scenario in which the system includes a client (600) and a storage appliance. The storage appliance includes a control module (604) and a storage module (614). The control module includes a processor (606) and a memory (608) where the memory includes an in-memory data structure (610) (see e.g., FIG. 4).

In this example, assume that the control module (CM) detects a P/E cycle value anomaly in solid state memory module A (620) and, consequently, performs the method shown in FIG. 5A. Specifically, the CM generates and issues a CM write request (700) to a sample set of physical addresses in solid state memory module A (620). The storage module controller (616) in the storage module (614), in response to receiving the CM write request, issues a write command(s) (702) to solid state memory module A (620).

The CM then generates and issues a CM read request (704) to the sample set of physical addresses in solid state memory module A (620). The storage module controller (616) in the storage module (614), in response to receiving the CM read request, issues a write command(s) (706) to solid state memory module A (620).

The storage module controller (616), in response to the read request, obtains a copy of the data that is stored in the sample set from solid state memory module A (620) and the temperature value of solid state memory module A. The storage module controller (616) performs error correction on the obtained data using the ECC decoder (not shown) to obtain the FBC. The FBC along with the temperature value is subsequently provided to the CM (604) as part of a read response (708). The FBC in combination with the temperature value is then used to obtain P/E cycle value from the in-memory data structure (610). In this example, the calculated P/E cycle value from solid state memory module A is different than the P/E cycle value stored in the in-memory data structure for solid state memory module A. Accordingly, the in-memory data structure is updated to replace the currently stored P/E cycle value with the calculated P/E cycle value for physical addresses associated with solid state memory module A.

The storage appliance may subsequently service client read requests (not shown) in accordance with FIGS. 5B-5C using the calculated P/E cycle value for solid state memory module A (620).

One or more embodiments of the technology may be implemented using instructions executed by one or more processors in the storage appliance. Further, such instructions may correspond to computer readable instructions that are stored on one or more non-transitory computer readable mediums.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:

1. A method for managing persistent storage, the method comprising:
   selecting a sample set of physical addresses in a solid state memory module (SSMM), wherein the sample set of physical addresses is associated with a region in the SSMM;
   performing a garbage collection operation on the sample set of physical addresses;
   after the garbage collection operation, issuing a write request to the sample set of physical addresses;
   after issuing the write request, issuing a read request to the sample set of physical addresses to obtain a copy of data stored in the sample set of physical addresses;
   determining an error rate in the copy of the data stored using at least one selected from a group consisting of an Error Correction Code (ECC) codeword and, known data in the write request;
   determining a calculated P/E cycle value for the SSMM using at least the error rate; and
   updating an in-memory data structure in a control module with the calculated P/E cycle value.

2. The method of claim 1, further comprising:
   servicing at least one read request using the calculated P/E cycle value.

3. The method of claim 1, further comprising:
   prior to the selecting:
      determining that the region in the SSMM is not associated with a P/E cycle value.

4. The method of claim 1, further comprising:
   prior to the selecting:
      detecting a P/E cycle value anomaly in a P/E cycle value associated with the region.

5. The method of claim 4, wherein detecting the P/E cycle value anomaly comprises determining that a difference in the P/E cycle value for the region and a P/E cycle value for a second region in the SSMM is greater than an anomaly threshold.

6. The method of claim 1, further comprising:
   servicing at least one selected from a group consisting of a read request and a write request by the SSMM while determining the error rate.

7. The method of claim 1, wherein the error rate is a failed bit count (FBC).

8. The method of claim 7, wherein the FBC is a mean FBC of all FBCs determined from the copy of the data.

9. The method of claim 1, wherein the SSMM is one of a plurality of SSMM in a storage module.

10. The method of claim 1, wherein the SSMM comprises NAND flash.

11. The method of claim 1, wherein performing the garbage collection operation on the sample set of physical addresses comprises:
   determining that data stored in a physical address in the sample set of physical addresses is live;

selecting a new physical address, wherein the new physical address is associated with a known P/E cycle value; and storing a copy of the data at the new physical address.

12. The method of claim 11, wherein the new physical address is located in a second SSMM in a second storage module, wherein the SSMM is located in a storage module.

13. The method of claim 1, wherein the calculated P/E cycle value represents a P/E cycle value range.

14. A non-transitory computer readable medium comprising computer readable program code, which when executed by a computer processor enables the computer processor to:
  select a sample set of physical addresses in a solid state memory module (SSMM), wherein the sample set of physical addresses is associated with a region in the SSMM;
  perform a garbage collection operation on the sample set of physical addresses;
  after the garbage collection operation, issue a write request to the sample set of physical addresses;
  after issuing the write request, issue a read request to the sample set of physical addresses to obtain a copy of data stored in the sample set of physical addresses;
  determine an error rate in the copy of the data stored using at least one selected from a group consisting of an Error Correction Code (ECC) codeword and, known data in the write request;
  determine a calculated P/E cycle value for the SSMM using at least the error rate; and
  update an in-memory data structure in a control module with the calculated P/E cycle value.

15. The non-transitory computer readable medium of claim 14 further comprising computer readable program code, which when executed by the computer processor enables the computer processor to:
  service at least one read request using the calculated P/E cycle value.

16. The non-transitory computer readable medium of claim 14 further comprising computer readable program code, which when executed by the computer processor enables the computer processor to:
  service at least one selected from a group consisting of a read request and a write request by the SSMM while determining the error rate.

* * * * *